US012764976B2

(12) United States Patent
Gund

(10) Patent No.: US 12,764,976 B2
(45) Date of Patent: Oct. 13, 2026

(54) PHASE CHANGE MATERIAL MICROELECTROMECHANICAL SYSTEMS BASED ANALOG MEMORY AND COMPUTATIONAL DEVICE

(71) Applicant: HONEYWELL INTERNATIONAL INC., Charlotte, NC (US)

(72) Inventor: Ved Gund, Plymouth, MN (US)

(73) Assignee: HONEYWELL AEROSPACE US LLC, Phoenix, AZ (US)

( * ) Notice: Subject to any disclaimer, the term of this patent is extended or adjusted under 35 U.S.C. 154(b) by 471 days.

(21) Appl. No.: 18/364,138

(22) Filed: Aug. 2, 2023

(65) Prior Publication Data

US 2025/0048657 A1 Feb. 6, 2025

(51) Int. Cl.
*H10B 99/00* (2023.01)

(52) U.S. Cl.
CPC ............. *H10B 99/14* (2023.02); *H10B 99/10* (2023.02)

(58) Field of Classification Search
CPC ........ H10B 99/14; H10B 99/10; H10B 63/10; G11C 13/0004; G11C 11/54; G11C 11/56; G11C 23/00; G06N 3/065; H01G 5/16; B81B 7/02; G06F 7/523; H10N 70/231; H10N 70/8613
USPC .......................................................... 257/415
See application file for complete search history.

(56) References Cited

U.S. PATENT DOCUMENTS

| | | | |
|---|---|---|---|
| 7,463,507 | B2 | 12/2008 | Gruening-Von Schwerin et al. |
| 7,923,285 | B2 | 4/2011 | Lai et al. |
| 8,379,438 | B2 | 2/2013 | Tio Castro et al. |
| 8,900,930 | B2 | 12/2014 | Moon |
| 9,253,822 | B2 | 2/2016 | Lamorey |
| 9,887,685 | B2 | 2/2018 | Engelen et al. |
| 10,454,027 | B1 | 10/2019 | Howard et al. |

(Continued)

FOREIGN PATENT DOCUMENTS

| | | | |
|---|---|---|---|
| WO | 2020132037 | A1 | 6/2020 |
| WO | 2022207304 | A1 | 10/2022 |

OTHER PUBLICATIONS

James T. Best, Mohammad Ayaz Masud, Maarten P. De Boer, and Gianluca Piazza, Phase Change Nanoelectromechanical Relay for Nonvolatile Low Leakage Switching, Dec. 31, 2022.

(Continued)

*Primary Examiner* — Moazzam Hossain
(74) *Attorney, Agent, or Firm* — Ingrassia, Fisher & Lorenz LLP

(57) ABSTRACT

A computational device includes a phase-change material (PCM) variable microelectromechanical systems (MEMS) capacitor and a power source. The PCM variable MEMS capacitor includes a substrate, a first electrode, a second electrode, a PCM, and a heater. The first electrode is spaced apart from the substrate to define a PCM cavity. The second electrode is spaced apart from the first electrode to define a capacitance gap. The PCM is disposed within the PCM cavity. The heater element is coupled to receive a voltage pulse, whereby a temperature of the PCM varies to thereby vary the capacitance gap. The power source is coupled to the PCM variable MEMS capacitor and is operable to (i) supply the voltage pulse to the heater and (ii) a time-dependent voltage between the first electrode and the second electrode, to thereby implement a single multiply operation.

18 Claims, 3 Drawing Sheets

(56) References Cited

U.S. PATENT DOCUMENTS

| | | | | |
|---|---|---|---|---|
| 10,580,473 | B2 * | 3/2020 | Ge | G06G 7/16 |
| 2005/0263801 | A1 | 12/2005 | Park et al. | |
| 2011/0038093 | A1 | 2/2011 | Furukawa et al. | |
| 2012/0286892 | A1 * | 11/2012 | Gu | H04B 1/525<br>333/17.1 |
| 2014/0376149 | A1 * | 12/2014 | Lamorey | H01G 7/00<br>29/25.42 |
| 2022/0004860 | A1 * | 1/2022 | Tran | G11C 11/54 |
| 2022/0020545 | A1 * | 1/2022 | Best | H01H 37/36 |
| 2024/0215462 | A1 * | 6/2024 | Li | G11C 13/0004 |
| 2026/0031112 | A1 * | 1/2026 | Tran | G06N 3/065 |

OTHER PUBLICATIONS

Abu Sebastian1 , Manuel Le Gallo and Evangelos Eleftheriou, Computational phase-change memory: beyond von Neumann computing, Aug. 20, 2019.

Giusy Lama, Phase Change Memory (PCM) for High Density Storage Class Memory (SCM) Applications, Mar. 23, 2023.

Y H.-S. Philip Wong, Fellow IEEE, Simone Raoux, Senior Member IEEE, Sangbum Kim, Jiale Liang, Student Member IEEE, John P. Reifenberg, Bipin Rajendran, Member IEEE, Mehdi Asheghi, and Kenneth E. Goodson, Phase Change Memory, Dec. 31, 2010.

Benjamin C. Lee, Engin Ipek, Onur Mutlu, Doug Burger, Architecting Phase Change Memory as a Scalable DRAM Alternative, Jun. 20, 2009.

Zhi-Cheng Liu and Lei Wang, Applications of Phase Change Materials in Electrical Regime From Conventional Storage Memory to Novel Neuromorphic Computing, May 7, 2020.

Nicolás Wainstein , Graduate Student Member IEEE, Gina Adam , Member IEEE, Eilam Yalon , Member IEEE, and Shahar Kvatinsky, Radio Frequency Switches Based on Emerging Resistive Memory Technologies: A Survey, Aug. 7, 2020.

* cited by examiner

PHASE CHANGE MATERIAL MICROELECTROMECHANICAL SYSTEMS BASED ANALOG MEMORY AND COMPUTATIONAL DEVICE

TECHNICAL FIELD

The present disclosure generally relates to memory and computational devices and, more particularly, to analog memory and computational devices based on phase change material (PCM) microelectromechanical systems (MEMS) devices.

BACKGROUND

Current processor architectures include memory that is separated from the processor core. This architecture is traditionally known as the von Neumann computing architecture. In such an architecture, the data rate of information transfer from the memory to the computing core can create a bottleneck for the speed of processing. This, in turn, can make this architecture inadequate for brain-like computing (e.g., artificial intelligence (AI)) and large machine learning (ML) applications, which rely on accurate, predictive, and high-performance computing solutions. Examples of these applications include advanced materials discovery, chemical synthesis, radiation electrodynamics, fluid dynamics, energy or mass transport through heterogeneous media, semiconductor device design and fabrication, and earth-system models.

There are two major challenges with current state of the art technologies. The first challenge relates to computational latency. Specifically, the cost of multiply and accumulate (MAC) operations, which are the building blocks of large-scale modeling and computation, increases exponentially with the number of parameters and the scale of the problem (e.g., $O(N^2)$ scaling). The second challenge relates to energy and bit resolution. Specifically, current approaches to memory and computing use electronic circuit elements that consume relatively high power, due standby leakage currents, and have inherently large electronic noise, which can reduce the bit resolution.

Hence, there is a need for a computational device that does not exhibit the computational latency or the energy and bit resolution issues of currently known devices. The present disclosure addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a computational device includes a phase-change material (PCM) variable microelectromechanical systems (MEMS) capacitor and a power source. The PCM variable MEMS capacitor includes a substrate, a first electrode, a second electrode, a PCM, and a heater. The first electrode is coupled to the substrate and has a first electrode inner surface and a first electrode outer surface. The first electrode inner surface is spaced apart from the substrate to define a PCM cavity between the first electrode inner surface and the substrate. The second electrode is coupled to the substrate and has a second electrode inner surface and a second electrode outer surface. The second electrode inner surface is spaced apart from the first electrode outer surface to define a capacitance gap between the inner and outer electrodes. The PCM is disposed within the PCM cavity. The heater element is disposed within the PCM cavity and is coupled to receive a voltage pulse, whereby a temperature of the PCM varies to thereby vary the capacitance gap. The power source is coupled to the PCM variable MEMS capacitor and is operable to (i) supply the voltage pulse to the heater and (ii) a time-dependent voltage between the first electrode and the second electrode, to thereby implement a single multiply operation.

In another embodiment, a computational device includes a plurality of phase-change material (PCM) variable microelectromechanical systems (MEMS) capacitors, a power source, and a circuit. The PCM variable MEMS capacitors are electrically connected in a cross-bar array configuration and each includes a substrate, a first electrode, a second electrode, a PCM, and a heater. Each first electrode is coupled to the substrate and has a first electrode inner surface and a first electrode outer surface. The first electrode inner surface is spaced apart from the substrate to define a PCM cavity between the first electrode inner surface and the substrate. Each second electrode is coupled to the substrate and has a second electrode inner surface and a second electrode outer surface. The second electrode inner surface is spaced apart from the first electrode outer surface to define a capacitance gap between the inner and outer electrodes. The PCM is disposed within the PCM cavity. Each heater element is disposed within the PCM cavity and is coupled to receive a voltage pulse, whereby a temperature of the PCM varies to thereby vary the capacitance gap. The power source is coupled to each PCM variable MEMS capacitor and is operable to (i) supply the voltage pulse to each heater and (ii) a time-dependent voltage between each of the first electrodes and each of the second electrodes, whereby a single multiply operation is implemented by each PCM variable MEMS capacitor. The circuit is coupled to each PCM variable MEMS capacitor and is configured to sum together each of the single multiply operations implemented by each PCM variable MEMS capacitor.

In yet another embodiment, an analog memory device includes a phase-change material (PCM) variable microelectromechanical systems (MEMS) capacitor and a voltages source. The PCM variable MEMS capacitor includes a substrate, a first electrode, a second electrode, a PCM, and a heater. The first electrode is coupled to the substrate and has a first electrode inner surface and a first electrode outer surface. The first electrode inner surface is spaced apart from the substrate to define a PCM cavity between the first electrode inner surface and the substrate. The second electrode is coupled to the substrate and has a second electrode inner surface and a second electrode outer surface. The second electrode inner surface is spaced apart from the first electrode outer surface to define a capacitance gap between the inner and outer electrodes. The PCM is disposed within the PCM cavity. The heater element is disposed within the PCM cavity and is coupled to receive a voltage pulse, whereby a temperature of the PCM varies to thereby vary the capacitance gap. The voltage source is coupled to the heater element and is configured to supply the voltage pulse that has a magnitude and duration that ensures the second electrode inner surface remains spaced apart from the first electrode outer surface.

Furthermore, other desirable features and characteristics of the computational device and analog memory device will become apparent from the subsequent detailed description and the appended claims, taken in conjunction with the accompanying drawings and the preceding background.

BRIEF DESCRIPTION OF DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
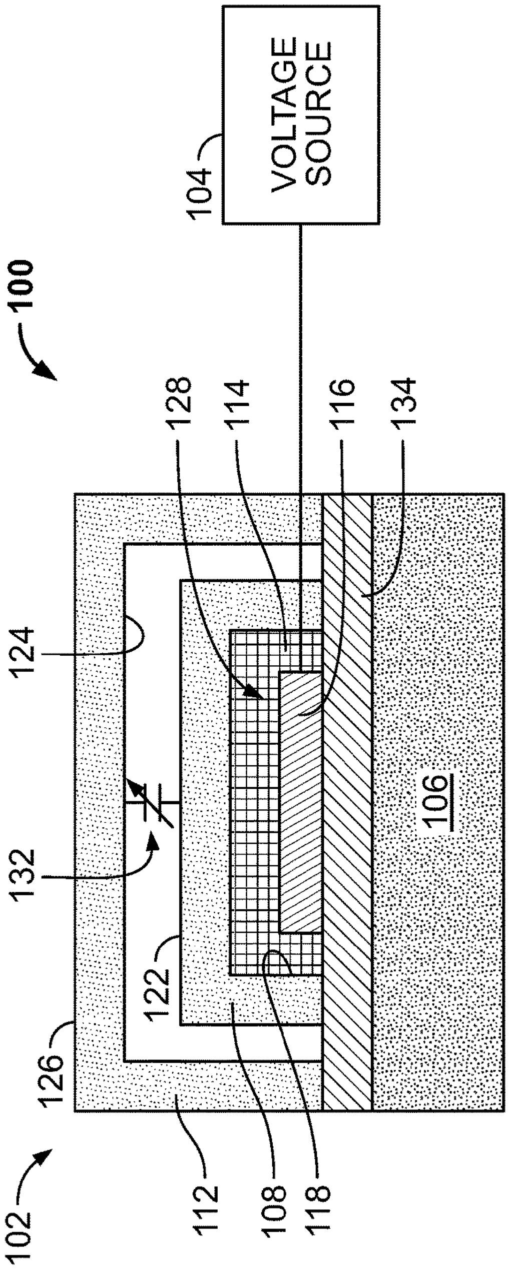
FIGS. 1 and 2 depict simplified cross section views of one embodiment of a single analog memory device.

Referring first to FIG. 1, a simplified cross section view of one embodiment of an analog memory device is depicted. The analog memory device 100 includes a phase-change material (PCM) variable microelectromechanical systems (MEMS) capacitor 102 and a voltage source 104. The PCM variable MEMS capacitor 102 includes a substrate 106, a first electrode 108, a second electrode 112, a PCM 114, and a heater element 116. It will be appreciated that the substrate 106 may be formed of any one of numerous known electrical insulator or semiconductor materials. In one example embodiment, the substrate 106 is formed of silicon.

The first electrode 108 and the second electrode 112 are both coupled to the substrate 106. The first electrode has a first electrode inner surface 118 and a first electrode outer surface 122 and the second electrode 112 has a second electrode inner surface 124 and a second electrode outer surface 126. The first electrode inner surface 118 is spaced apart from the substrate 106 to define a PCM cavity 128 between the first electrode inner surface 118 and the substrate 106. The second electrode inner surface 124 is spaced apart from the first electrode outer surface 122 to define capacitance gap 132 between the inner and outer electrodes 108, 112. It will be appreciated that the first and second electrodes 108, 112 may be formed of any one of numerous known electrically conductive materials. In one example embodiment, the first and second electrodes each comprise platinum and platinum.

The PCM 114 is disposed within the PCM cavity 128. As is generally known, a PCM 114 is a material that can be reversibly and rapidly switched between crystalline and amorphous phases. As is also generally known, various physical properties of PCMs change when it is switched between crystalline and amorphous phases. One of these physical properties is density and, as will be described momentarily, is the property variation that is used to vary the capacitance gap 132. It will be appreciated that the PCM 114 may be implemented using any one of numerous known PCMs. In one example embodiment, the PCM 114 is implemented using germanium telluride.

Figure 2:
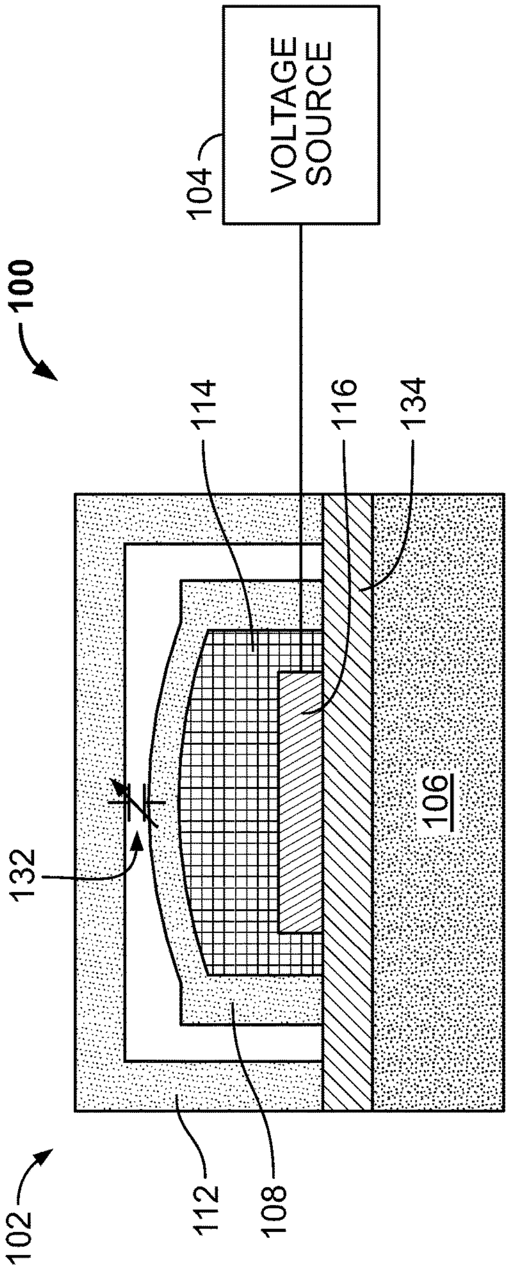

The PCM 114 may be controllably switched between its crystalline and amorphous phases by controllably varying its temperature. Indeed, that is the purpose of the heater element 116. The heater element 116 is disposed within the PCM cavity 128 and is coupled to receive a voltage pulse. The voltage pulse causes the temperature of the heater element 116 to vary, which in turn varies temperature of the PCM 114. This variation in temperature of the PCM 114, varies the density of the PCM 114. As FIGS. 1 and 2 depict, varying the density of the PCM 114 varies the capacitance gap 132. It will be appreciated that the heater element 116 may comprise any one of numerous known materials. In one example embodiment, the heater element 116 comprises tungsten.

Before proceeding further, it is seen that, at least in the embodiment depicted in FIGS. 1 and 2, the PCM variable MEMS 102 additionally includes an isolation layer 134. The isolation layer 134, when included, is formed on a surface 136 of the substrate 106 and is disposed between the substrate 106 and each of the first electrode 108, the second electrode 112, the PCM 114, and the heater element 116. It will be appreciated that the isolation layer 134 may comprise any one of numerous known materials. IN one example embodiment, the isolation layer 134 comprises silicon nitride_.

The voltage pulse is supplied to the heater element 116 from the voltage source 104. Thus, as FIGS. 1 and 2 depict, the voltage source 104, which may be implemented on the same substrate 102 as the PCM variable MEMS 102, is coupled to the heater element 116. It will be appreciated that the magnitude and duration of the voltage pulse supplied to the heater element 116 may (and typically will) vary. Indeed, as will now be explained, the capacitance gap 132 between the first and second electrodes 108, 112 can be modulated using specific voltage pulse profiles. It is noted, however, the voltage pulse supplied to the heater element 116 will always have a magnitude and duration that ensures that the capacitance gap 132 always exists; that is, that the second electrode inner surface 124 remains spaced apart from the first electrode outer surface 122.

The capacitance gap 132 is set, as noted above, with voltage pulse, according to the following relationship:

$$C = \frac{\epsilon A}{g - y}$$

where, $\epsilon$ is the permittivity, A is the capacitor area, g is the initial gap in the crystalline phase, and y is the effective change in the capacitance gap 132 due to the volume expansion of the PCM 114 in response to input voltage profile pulse.

The effective change in the capacitance gap 132 (y) is set as follows:

$$y = SF^{*}V_{PCM}$$

where, $V_{PCM}$ is the pulse applied to the PCM 114 and SF is a scale factor that relates voltage and input Joule heating to PCM displacement. As may be appreciated the scale factor varies with the selection of the PCM 114.

Figure 3:
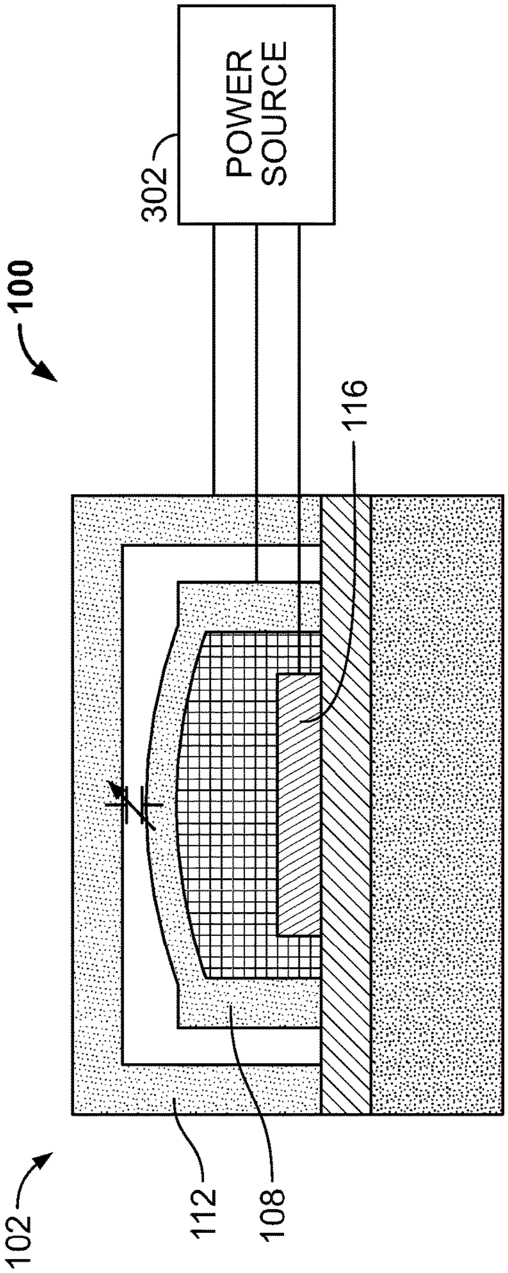
FIG. 3 depicts a functional block diagram of one embodiment of a computational device that includes the analog memory device depicted in FIG. 1.

The PCM variable MEMS capacitor 102 depicted in FIGS. 1 and 2 can also be used to implement a computational device, such as the one depicted in FIG. 3. As depicted therein, the computational device 300, in addition to the PCM variable MEMS capacitor 102, includes a power source 302. The power source 302 is coupled to the PCM variable MEMS capacitor 102 and is operable to supply the voltage pulse to the heater element 116, as described above. In addition, the power source 302 is further configured to supply a time-dependent voltage between the first electrode 108 and the second electrode 112, to thereby implement a single multiply operation. As may be appreciated, the time-dependent voltage supplied by the power source 302 may vary, but it is preferably either a sinusoidal voltage (i.e., V sin (ωt)) or a ramp voltage (i.e., V*ramp).

More specifically, the depicted computational device 300 computes the capacitive current (I) for the set capacitance gap 132 (i.e., g-y) when the power source 302 is supplying the time-dependent voltage between the first electrode 108 and the second electrode 112 as follows:

$$\frac{dQ}{dt} = \frac{\in A}{g-y}\left(\frac{dV}{dt}\right) = \frac{\in A}{g}\left(1+\frac{y}{g}\right)\left(\frac{dV}{dt}\right).$$

Thus, when the time-dependent voltage is a ramp:

$$I = \frac{\in A}{g}\left(1 + SF * \frac{V_{pcm}}{g}\right)V_{in}\Delta t = \frac{\in A}{g}V_{in}\Delta t + \in A\left(SF\frac{V_{pcm}V_{in}}{g}\right)\Delta t.$$

The output current (I) has a DC offset, which can be filtered out, and a multiplicative term, which is a single multiply operation.

Figure 4:
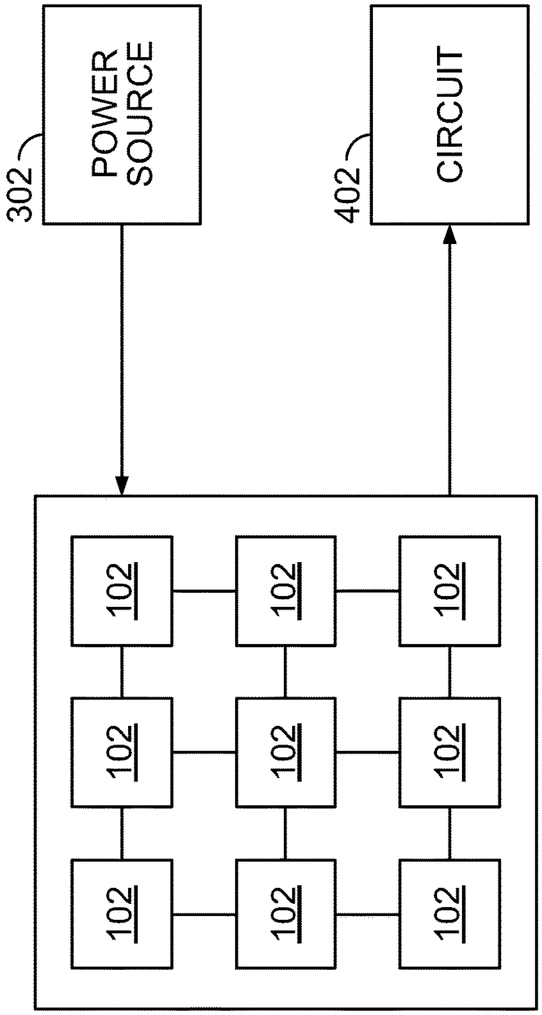
FIG. 4 depicts a functional block diagram of one embodiment of a computational device that includes a plurality of the analog memory devices depicted in FIG. 1.

Turning now to FIG. 4, it is seen that a computational device 400 may also be implemented using a plurality of PCM variable MEMS capacitors 102. It will be appreciated that for clarity and ease of depiction, only nine PCM variable MEMS capacitors 102 are illustrated. In other embodiments, the computational device 400 may include more or less than this number. The computational device 400 also includes the previously described power source 302, and additionally includes a circuit 402. The circuit 402, which may also be implemented on the same substrate 102 as the PCM variable MEMS 102 and the purpose of which is described momentarily, is preferably implemented as a summing circuit, such as an op-amp with high resistive feedback.

Figure 5:
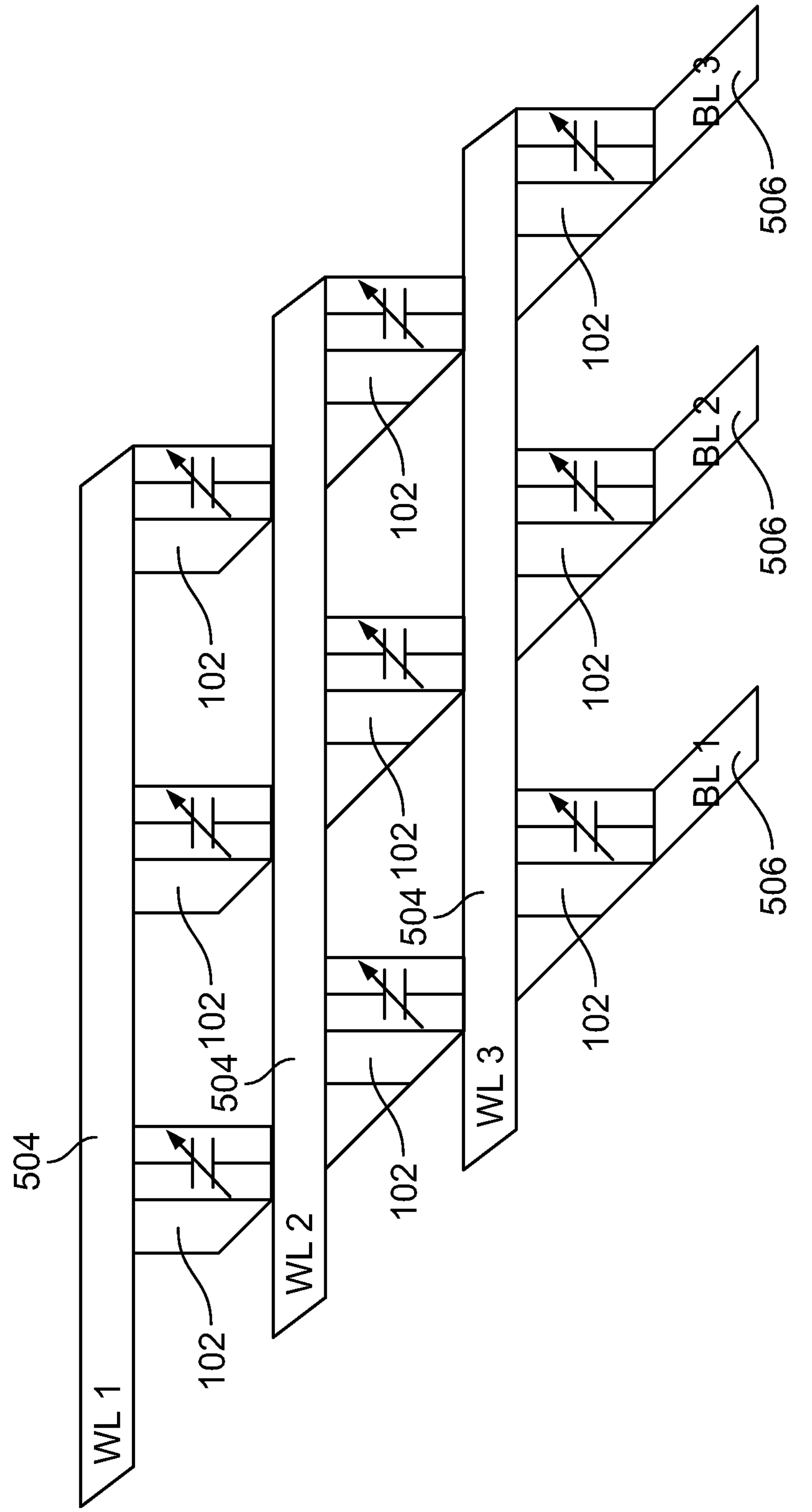
FIG. 5 depicts a simplified representation of a plurality of the analog memory devices connected in a crossbar array configuration.

Preferably, the PCM variable MEMS capacitors 102 are electrically connected in a crossbar array configuration. As is generally known, and as FIG. 5 depicts, a crossbar array configuration includes a plurality of parallel word lines 504 and a plurality of parallel bit lines 506, which are disposed perpendicular to each other. In the depicted embodiment, each word line 504 is electrically coupled to the second electrodes 112 of a predetermined number of PCM variable MEMS capacitors 102, and each bit line 506 is electrically coupled to the first electrodes 108 of the predetermined number of PCM variable MEMS capacitors 102.

With this configuration, the output currents (i.e., single multiply operations) from each of the PCM variable MEMS capacitors 102 is supplied to the circuit 402, which configured to sum together each of the single multiply operations implemented by each PCM variable MEMS capacitor 102, as follows:

$$\Sigma I = \Sigma \in A\left(SF\frac{V_{pcm}V_{in}}{g}\right)\Delta t = C_1\Sigma V_{pcm}V_{in}.$$

This devices described herein can be used to implement a high-performance, large bit-resolution, compute-in-memory core and MAC operator. The multiplication of the array of PCM variable MEMS capacitors 102, with $V_{pcm}$ and Vin as inputs, is able to produce a multiply-and-accumulate (MAC) operation in constant time, where $C_1$ is a constant. In other words, the MAC operations can be performed with a scaling factor of O(1) as compared to $O(N^2)$ of known devices. The PCM variable MEMS capacitors 102 employ capacitive current-based readout with air gaps, which eliminates leakage currents the and makes the architecture highly immune to noise, thereby improving bit resolution.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A computational device, comprising:

a phase-change material (PCM) variable microelectromechanical systems (MEMS) capacitor, the PCM variable MEMS capacitor comprising:

(i) a substrate;

(ii) a first electrode coupled to the substrate and having a first electrode inner surface and a first electrode outer surface, the first electrode inner surface spaced apart from the substrate to define a PCM cavity between the first electrode inner surface and the substrate;

(iii) a second electrode coupled to the substrate and having a second electrode inner surface and a second electrode outer surface, the second electrode inner surface spaced apart from the first electrode outer surface to define a capacitance gap between the first and second electrodes;

(iv) a PCM disposed within the PCM cavity; and (v) a heater element disposed within the PCM cavity and coupled to receive a voltage pulse, whereby a temperature of the PCM varies to thereby vary the capacitance gap; and a power source coupled to the PCM variable MEMS capacitor and operable to (i) supply the voltage pulse to the heater element and (ii) a time-dependent voltage between the first electrode and the second electrode, to thereby implement a single multiply operation.

2. The computational device of claim 1, wherein the time-dependent voltage is a sinusoidal voltage.

3. The computational device of claim 1, wherein the time-dependent voltage is a ramp voltage.

4. The computational device of claim 1, wherein the PCM variable MEMS further comprises an isolation layer formed on a surface of the substrate and disposed between the substrate and each of the first electrode, the second electrode, the PCM, and the heater element.

5. The computational device of claim 4, wherein the isolation layer comprises silicon nitride or aluminum nitride.

6. The computational device of claim 1, wherein the substrate comprises silicon or silicon carbide.

7. The computational device of claim 1, wherein the heater comprises tungsten.

8. The computational device of claim 1, wherein the PCM comprises germanium telluride.

9. The computational device of claim 1, wherein the first and second electrodes each comprise platinum and platinum.

10. A computational device, comprising:

a plurality of phase-change material (PCM) variable microelectromechanical systems (MEMS) capacitors, the PCM variable MEMS capacitors electrically connected in a cross-bar array configuration, each PCM variable MEMS capacitors comprising:

(i) a substrate;

(ii) a first electrode coupled to the substrate and having a first electrode inner surface and a first electrode outer surface, the first electrode inner surface spaced apart from the substrate to define a PCM cavity between the first electrode inner surface and the substrate;

(iii) a second electrode coupled to the substrate and having a second electrode inner surface and a second electrode outer surface, the second electrode inner surface spaced apart from the first electrode outer surface to define a capacitance gap between the first and second electrodes;

(iv) a PCM disposed within the PCM cavity; and (v) a heater element disposed within the PCM cavity and coupled to receive a voltage pulse, whereby a temperature of the PCM varies to thereby vary the capacitance gap;

a power source coupled to each PCM variable MEMS capacitor and operable to (i) supply the voltage pulse to each heater element and (ii) a time-dependent voltage between each of the first electrodes and each of the second electrodes, whereby a single multiply operation is implemented by each PCM variable MEMS capacitor; and a circuit coupled to each PCM variable MEMS capacitor and configured to sum together each of the single multiply operations implemented by each PCM variable MEMS capacitor.

11. The computational device of claim 10, wherein the time-dependent voltage is a sinusoidal voltage.

12. The computational device of claim 10, wherein the time-dependent voltage is a ramp voltage.

13. The computational device of claim 10, wherein the PCM variable MEMS further comprises an isolation layer formed on a surface of the substrate and disposed between the substrate and each of the first electrode, the second electrode, the PCM, and the heater element.

14. The computational device of claim 13, wherein the isolation layer comprises silicon nitride or aluminum nitride.

15. The computational device of claim 10, wherein the substrate comprises silicon or silicon carbide.

16. The computational device of claim 10, wherein the heater comprises tungsten.

17. The computational device of claim 10, wherein the PCM comprises germanium telluride.

18. The computational device of claim 10, wherein the first and second electrodes each comprise platinum.

* * * * *